United States Patent [19]
Hsue

[11] Patent Number: 5,594,684
[45] Date of Patent: Jan. 14, 1997

[54] POLYSILICON PROGRAMMING MEMORY CELL

[75] Inventor: Chen-Chiu Hsue, Hsin-Chu, Taiwan

[73] Assignee: United Microelectronics Corporation, Hsin-Chu, Taiwan

[21] Appl. No.: 665,532

[22] Filed: Jun. 18, 1996

Related U.S. Application Data

[63] Continuation of Ser. No. 245,504, May 18, 1994, abandoned.

[51] Int. Cl.⁶ ............................................. B11C 16/06
[52] U.S. Cl. ...................... 365/185.01; 365/185.05; 365/125.24; 365/104
[58] Field of Search ........................ 365/185, 185.01, 365/185.05, 185.24, 104; 257/316

[56] References Cited

U.S. PATENT DOCUMENTS

| | | | |
|---|---|---|---|
| 5,051,796 | 9/1991 | Gill | 365/185 |
| 5,110,753 | 5/1992 | Gill et al. | 257/316 |
| 5,160,986 | 11/1992 | Gellezza | 365/185 |
| 5,241,193 | 8/1993 | Pfiester et al. | 257/316 |
| 5,300,802 | 4/1994 | Komori et al. | 257/316 |
| 5,304,829 | 4/1994 | Mori et al. | 257/316 |
| 5,319,593 | 6/1994 | Wolstenholme | 365/185 |
| 5,326,999 | 7/1994 | Kim et al. | 365/185 |
| 5,338,956 | 8/1994 | Nakamura | 365/185 |
| 5,378,909 | 1/1995 | Chang et al. | 257/316 |

*Primary Examiner*—Joseph E. Clawson, Jr.

[57] ABSTRACT

A method for programming a memory cell is disclosed. The state of the memory cell is determined by the presence or absence of a spacer short. A memory cell has a floating gate, a control gate and an insulating layer separating the floating gate and the control gate. Spacers are deposited on the sides of the control gate and the insulating layer. When the cell is selected to be programmed in the "off" or non-conductive state, the spacers are in contact only with the control gate and the insulating layer. When the cell is selected to be programmed in the "on" or conductive state, the spacers are in contact with the control gate, the insulating layer, and the floating gate, thereby creating a spacer short.

12 Claims, 4 Drawing Sheets

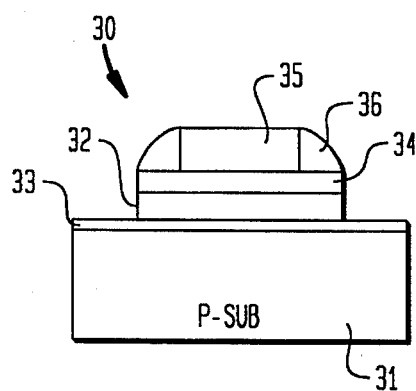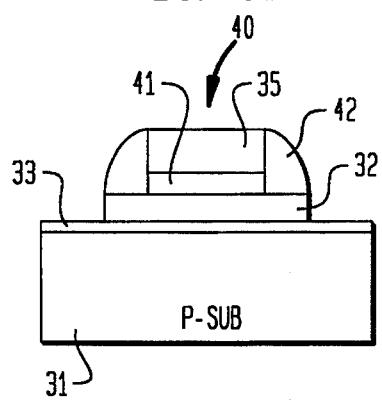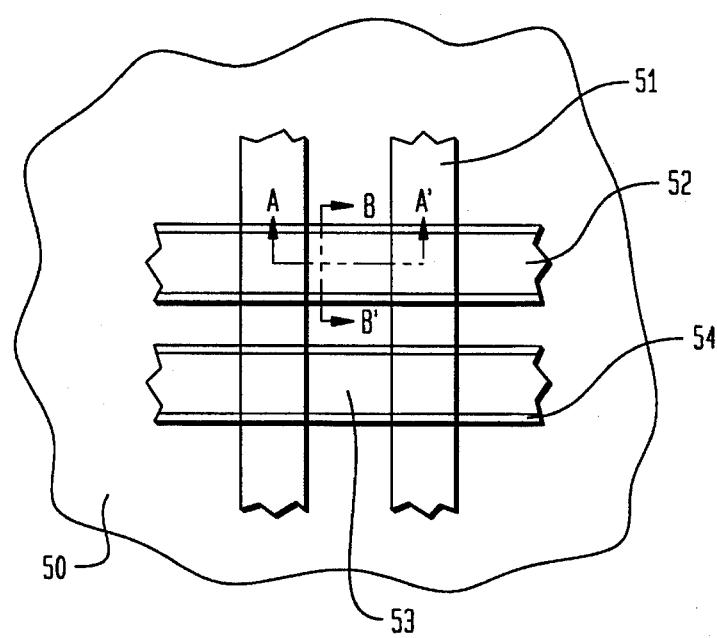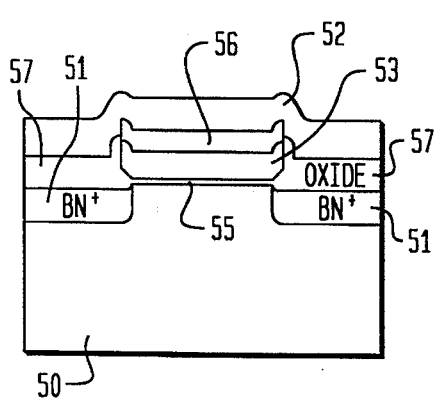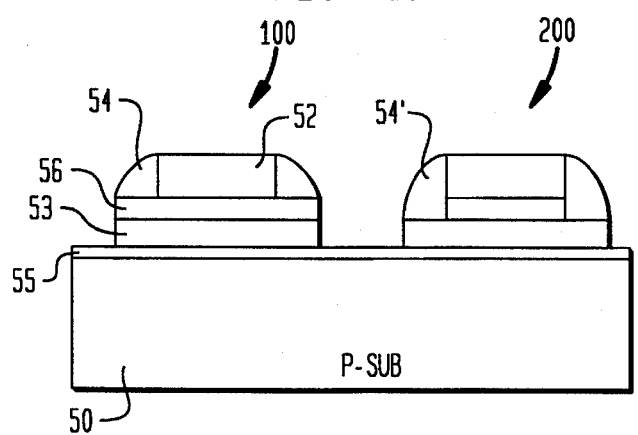

POLYSILICON PROGRAMMING MEMORY CELL

This is a continuation of application Ser. No. 08/245,504, filed May 18, 1994 now abandoned.

FIELD OF THE INVENTION

This invention relates to a memory cell and a process for making the memory cell. Specifically, it relates to the programming of a memory cell which is programmed by the presence or absence of a spacer short instead of by the presence or absence of implanted impurities in the channel.

1. Related Application

Two patent applications, respectively entitled, "Buried Bit Line ROM with Low Bit Line Resistance" bearing Ser. No. 08/092,189, filed on Jul. 14, 1993, and "Self-Aligned Buried $N^+$ Bit Line Mask ROM Process" bearing Ser. No. 08/242,787, filed on May 16, 1994 are assigned to the assignee hereof. These applications contain subject matter related to the subject matter of the present application and are hereby incorporated by reference.

2. Background of the Invention

A ROM (Read Only Memory) is an array of ROM cells. A top view of a conventional array of ROM cells is shown in FIG. 1 and a cross section of an individual cell is shown in FIG. 2. A ROM array has some cells which are conductive and some cells which are not conductive. A ROM mask process allows selective implantation of the ROM code, so that some cells are conductive and some are not. The purpose of a mask ROM process is to enable some cells to be conductive and others to not be conductive. This conductivity selection is accomplished by selective implantation of ions, such as boron, into the channels of selected ROM cells.

Referring to FIGS. 1 and 2, the ROM array 10 is formed on a substrate 11 having a first dopant type. Illustratively, the substrate is P-type silicon with a doping concentration of $10^{15}/cm^3$. A plurality of parallel $N^+$ type buried bit lines 12 are formed in the substrate 11. A plurality of polysilicon word lines 14 are formed orthogonal to the bit lines on the surface of the substrate 11. The ROM comprises a plurality of cells. One such cell 13 is delineated in FIG. 1 and shown in a cross-sectional view taken along line AA' in FIG. 2.

As shown in FIG. 2, the cell 13 comprises two parallel buried bit lines 12 which form source and drain regions for the cell. A channel 20 of length S is formed between the two bit lines in the cell 13. A gate oxide layer 21 is formed on top of the substrate 11. The oxide layer is thick at portions 22 which are located above the bit lines 12 and thin at portion 23 located over the channel 20. The thick portions 22 are approximately 350 Angstroms and the thin portions 23 are approximately 200 Angstroms. A polysilicon word line 24 is formed over the gate oxide layer 21. A photo resist layer 25 is formed and patterned on the polysilicon layer as a mask. Boron is implanted in cells for which the photoresist layer is removed and not implanted in cells which remain covered by the photo-resist. The implanted boron turn off the conducting state for the "off" cell (this programs the cell).

These conventional memory cells are programmed by the implantation of a ROM code via ROM code masking process. This type of programming is problematic for a number of reasons including 1) the alignment of the implanted code is difficult, 2) the voltage level of the junction breakdown is limited and 3) the resulting cells are unsuitable for high voltage operation.

It is an object of the present invention to provide a memory cell which is programmed by the presence or absence of a spacer short.

It is another object of the present invention to provide a memory cell which is self-aligned in programming.

It is still another object of the present invention to provide a memory cell which is suitable for higher voltage operation and lower junction leakage.

It is yet another object of the present invention to provide a memory cell having a junction breakdown voltage greater than 10 volts.

SUMMARY OF THE INVENTION

These and other objectives are achieved by providing a ROM cell which is programmed by the absence or presence of a spacer short. The ROM cell comprises a gate structure including a floating gate separated from the cell channel by an insulating layer and a control gate formed in top of the floating gate and separated from the floating gate by insulating material. Preferably, the floating gate has a longer length than the control gate. The floating gate and control gate of the cell are doped to become conducting.

In an "off" memory cell, the floating gate is separated from the control gate by insulating material. This insulating material extends across the entire length of the floating gate. In an "on" memory cell, the insulating material is only as long as the control gate. Polysilicon spacers are deposited on either side of the control gate. These spacers contact both the control gate and the floating gate creating a short between the control gate and the floating gate and putting the cell in the "on" state. If there is no short, the cell is in the "off" state.

In one embodiment of the present invention a ROM cell is provided which comprises a substrate including first and second bit lines spaced apart by a channel. A floating gate is formed over said channel. A control gate is formed over said floating gate. The floating gate and the control gate are connected by a conducting path if the cell is programmed to be on and the floating gate and the control gate are insulated from one another if the cell is programmed to be off.

In another embodiment of the present invention a ROM array is provided which comprises a plurality of cells formed in a substrate. Each of the cells includes first and second bit lines which are separated by a channel. A floating gate is formed over the channel and a control gate is formed over the floating gate. In a first plurality of the cells, the floating gate and the control gate are electrically connected. In a second plurality of the cells, the floating gate and the control gate are electrically insulated.

In yet another embodiment of the present invention a memory cell programmed in the off state is provided. This cell comprises a gate oxide grown on a substrate having a first dopant type. A floating gate is disposed on the gate oxide. An insulating layer extends over the entire length of the floating gate. A control gate extends over a portion of the insulating layer, thereby, leaving first and second portions of the insulating layer exposed on each side. First and second spacers are disposed on each side of the control gate and over the first and second exposed portions of the insulating layer.

In still another embodiment of the present invention a memory cell in an "on" state is provided. This cell comprises a gate oxide grown on a substrate having a first dopant type. A floating gate is disposed on the gate oxide. An insulating layer extends over a portion of the floating gate, thereby, leaving first and second portions of the floating gate exposed on each side. A control gate is formed over the insulating layer. First and second spacers are formed on the first and second exposed portions of the floating gate. The spacers are in contact with the floating gate, the control gate and the insulating layer.

In another embodiment of the invention a process for making a memory cell is provided which comprises the following steps. Growing a gate oxide on a substrate having a first dopant type. Forming a floating gate on the gate oxide. Depositing an insulating layer over the floating gate. Forming first and second buried bit lines having a second dopant type in the substrate on either side of the floating gate. Forming a control gate over the insulating layer. Selecting whether the cell is to be programmed on or off. If the cell is selected to be off, the insulating layer is etched so that it extends beyond the edges of the control gate. If the cell is selected to be on, the insulating layer is etched so that it extends only beneath the control gate. Depositing and doping a layer of polysilicon over the control gate. Etching the layer of polysilicon to form first and second spacers on each side of the control gate. If the cell was selected "off", the first and second spacers contact the control gate and the insulating layer. Whereas if the cell was selected on, the first and second spacers contact the control gate, the insulating layer and the floating gate.

In yet another embodiment of the invention a process for programming a memory cell is provided. The memory cell has a floating gate, an insulating layer and a control gate separated from the floating gate by the insulating layer. The process comprises the following steps. Selecting if the cell is to be programmed off or on. If the cell is selected off, the insulating layer is etched so that it extends beyond the control gate and entirely covers the surface of the floating gate, and first and second spacers are formed on each side of the control gate. The spacers are in contact with the control gate and the insulating layer. If the cell is selected on, the insulating layer is etched so that it extends to the edges of the control gate, leaving portions of the floating gate exposed on each side, and first and second spacers are formed on the exposed portions of the floating gate. The spacers contact the insulating layer and the control gate.

BRIEF DESCRIPTION OF THE DRAWINGS

FIG. 3(a) illustrates a memory cell of the present invention in the "off" state;

FIG. 3(b) illustrates a memory cell of the present invention in the "on" state;

FIG. 4 illustrates a memory array for the present invention;

FIGS. 5(a) and (b) illustrate cross sections of a memory array of the present invention;

DETAILED DESCRIPTION OF THE PRESENT INVENTION

Figure 1:
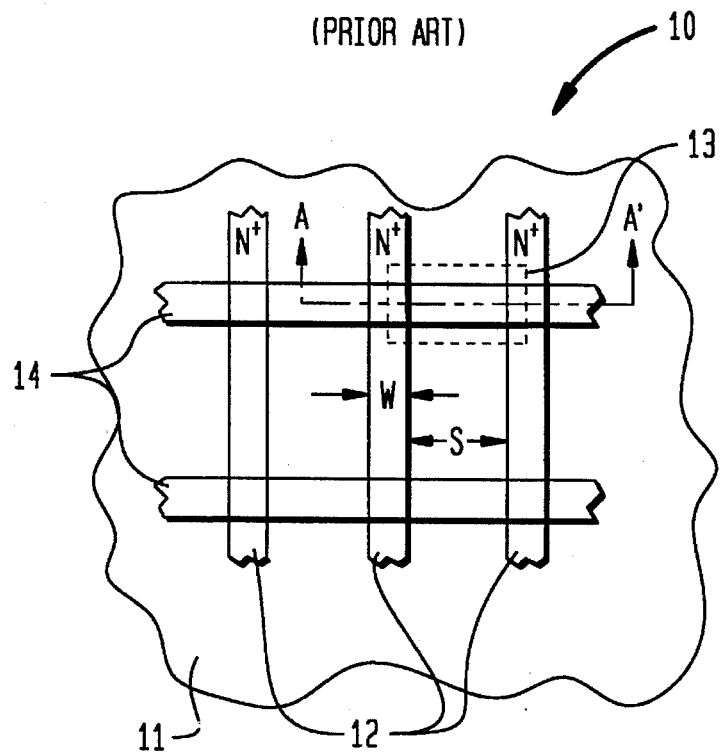
FIG. 1 illustrates a conventional memory array.
Figure 2:
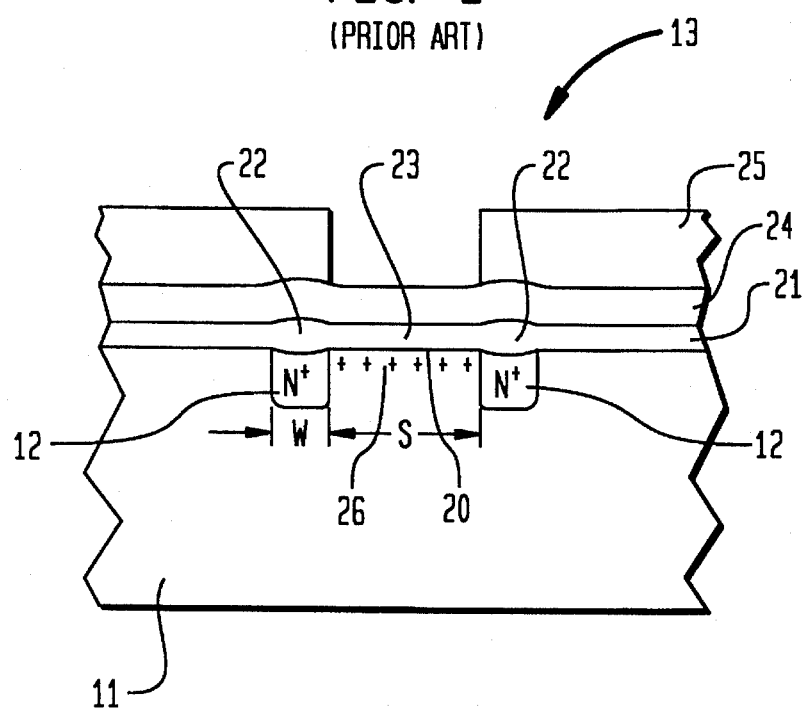
FIG. 2 illustrates a cross-section of one memory cell of FIG. 1.

A gate structure of a cell in the "off" state according to the invention is shown in FIG. 3(a). This gate structure 30 comprises a substrate 31 of first dopant type. Illustratively, the substrate is P-type silicon having a doping concentration of $10^{15}/cm^3$. A polysilicon floating gate 32 is disposed on the substrate and separated from the substrate by a gate oxide 33. An insulating layer 34, preferably nitride ($Si_3N_4$) having a thickness of approximately 1000 Å, is formed on top of and extending over the floating gate 32. A polysilicon control gate 35 is formed over a portion of the insulating layer 34, leaving a portion of the insulating layer 34 exposed on each side. Polysilicon or polysilicide spacers 36 are formed only on the exposed portions of the nitride layer 34. These spacers 36 are in contact with the control gate 35 but not the floating gate 32.

A gate structure of a memory cell 40 in the "on" state is shown in FIG. 3(b). This cell also comprises a substrate 31 of a first dopant type. A gate oxide 33 is formed over the substrate 31. A floating gate 32 is formed over the gate oxide 33. An insulating layer 41, again preferably nitride ($Si_3N_4$), is formed over the floating gate 32 this time leaving portions of the floating gate 32 exposed on either side. A control gate 35 is formed over the nitride layer 41. Polysilicon or polysilicide spacers 42 are formed on the exposed portions of the floating gate and in contact with the control gate and the nitride layer. These contacts create a spacer short which programs the cell in an "on" or conductive state.

FIGS. 4 and 5 illustrate a memory cell according to the present invention. Referring to FIG. 4, a memory array is illustrated from a top view. The memory array comprises a substrate 50 of a first dopant type having parallel buried bit lines 51 of a second dopant type. Illustratively, the substrate is P-type silicon having a doping concentration of $10^{15}/cm^3$ and the bit lines are $N^+$ type. A plurality of wordlines 52 are formed orthogonal to the buried bit lines 51. Floating gates 53 are formed by the wordlines between the buried bit lines 51. Spacers 54 are formed between the wordline 52. These spacers are polysilicon or polysilicide, preferably $WSi_x$. The wordlines 52 form the control gates of the memory cell. The wordlines and floating gates are preferably made from polysilicon.

Cross-sections of the cells of the array are shown in FIGS. 5(a) and 5(b). FIG. 5(a) is a cell cross-section taken along line A—A' of FIG. 4 and FIG. 5(b) is a cross-section taken along line B—B' which shows the programming state of the cells.

Referring to FIG. 5(a), in a substrate 50 of a first dopant type are formed buried bit lines 51 of a second dopant type. A gate oxide 55 having a thickness of 200 Å is formed over the substrate 30 between the buried bit lines 51. A polysilicon floating gate 53 is formed between the buried bit lines 51 and over the gate oxide 55. An insulating layer 56 is formed over the floating gate. On top of the buried bit lines a buried $N^+(BN^+)$ oxide 57 is formed, having a thickness of approximately 600 Å. Illustratively, the insulating layer 56 is a nitride having a thickness of about 1000 Å. Over the insulating layer 56, a polysilicon wordline 52 is deposited which forms the control gate of the cell.

Figure 6A:
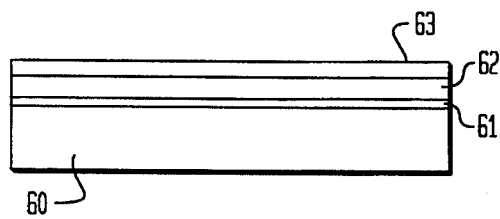
FIGS. 6 to 9 illustrate a process of the present invention.
Figure 6B:
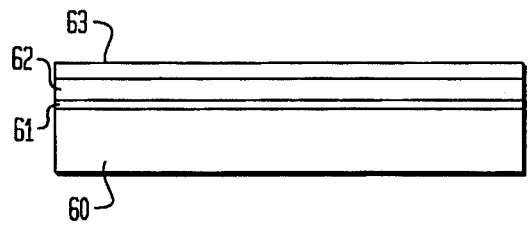

In FIG. 5(b), programmed "on" 100 and "off" 200 memory cells according to the present invention are shown. These cells are formed on the substrate 50 with a grown gate oxide 55. The "off" cell 100 is comprised of a floating gate 53, an insulating layer 56 formed over the entire length of the floating gate, a control gate 52 formed over a portion of the insulating layer, and spacers 54 formed on either side of the control gate 52 in contact with the control gate and the insulating layer but not the floating gate. The "on" cell 200 comprises a spacer short 54'. The spacer short comprises the spacers 54 in contact with both the floating gate 53 and the control gate 52, thereby creating a conductive or on state. FIGS. 6 to 9 illustrate the process of the present invention, where the "(a)" figures are cross sections taken along line A—A' in FIG. 4 and the "(b)" figures are cross sections taken along line B—B' in FIG. 4. Referring to FIGS. 6(a) and 6(b), the process starts with a substrate 60 of a first dopant type. The substrate is illustratively P-type silicon with a doping concentration of about $10^{15}/cm^3$. Next, a gate oxide 61 is grown to a thickness of about 200 Å on the surface of the substrate 60. Then a layer of polysilicon 62 having a thickness of about 1500 Å is deposited on the gate oxide 61. The polysilicon layer 62 is doped to a doping concentration of about $10^{21}/cm^3$, using $POCl_3$ as dopant. A insulating layer 63 having a thickness of about 1000 Å is then deposited on the polysilicon layer 62. The insulating material is, for example, a nitride.

Figure 7A:
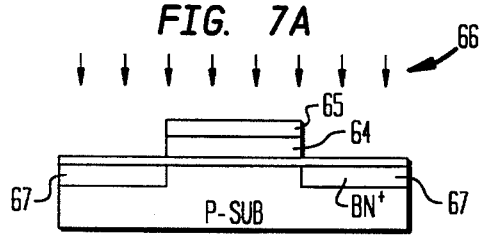
Figure 7B:
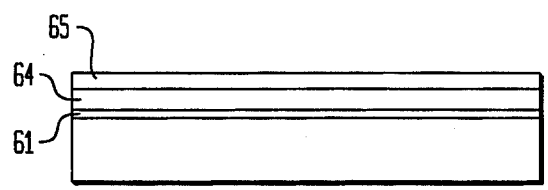

Referring to FIGS. 7(a) and 7(b), the polysilicon layer 62 and insulating layer 63 are then patterned so as to form floating gate 64 and insulating layer 65. Next, the buried bit lines 67 are formed by ion implantation, as indicated by arrows 66. Illustratively, the ion implantation is of Arsenic ions at about 80 kev and a dose unit of $5E15/cm^2$.

Figure 8A:
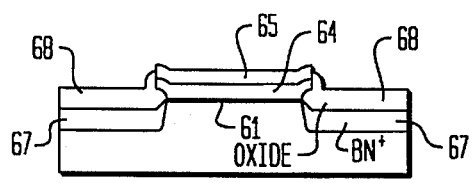
Figure 8B:
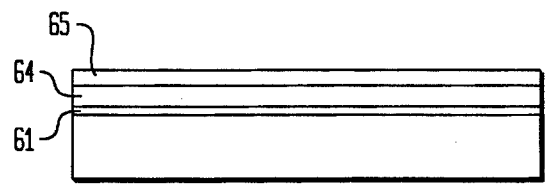

Referring to FIGS. 8(a) and 8(b), an oxidation process is performed to form $BN^+$ oxide regions 68 over the buried bit lines 67. During oxidation, part of the substrate is consumed so that these oxide regions 68 are formed into the surface of the substrate 60. The $BN^+$ oxide regions 68 have a thickness of approximately 600 Å.

Figure 9A:
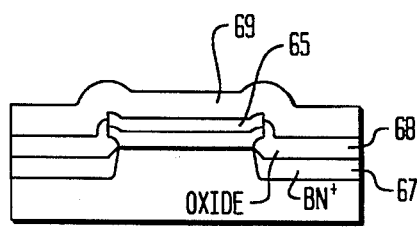
Figure 9B:
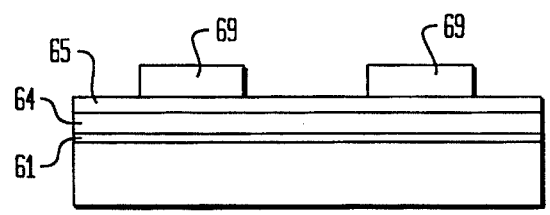

Referring to FIGS. 9(a) and 9(b), a second layer of polysilicon is deposited over the oxide regions 68 and the insulating layer 65. The second polysilicon layer is a wordline which forms the control gate. The second polysilicon layer is doped to a doping concentration of approximately $10^{21}/cm^3$, using $POCl_3$ as a dopant and patterned to form the control gates 69.

Figure 10A:
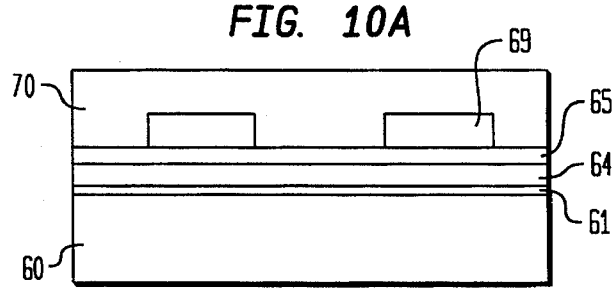
FIGS. 10(a) to (e) illustrate the programming of the cells according to the present invention.

FIGS. 10(a) to (e) illustrate the programming of the cells of the present invention. Referring to FIG. 10(a), a ROM code patterning process is performed. In this process, cells are selected to be either "on" or "off", i.e., conductive or non-conductive. A layer of photo-resist 70 is deposited over the control gates 69 and the nitride layer 65.

Figure 10B:
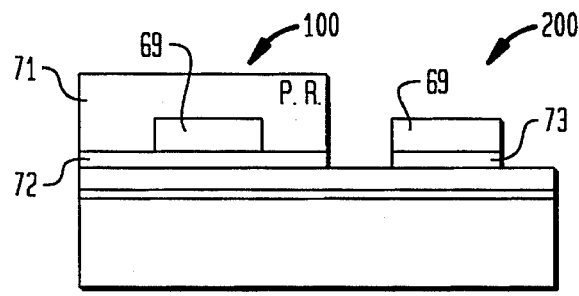

As shown in FIG. 10(b), the photo-resist is then masked and etched so that photo-resist 71 remains only over the cells 100 selected to be "off" or non-conductive. The nitride layer 65 is then etched, so that a portion 72 of the layer 65 in the "off" state cell 100 extends beyond the edges of the control gate 69. Whereas, a portion 73 of the nitride layer 65 in the "on" state cell 200 state extends only beneath the control gate 69 and not beyond.

Figure 10C:
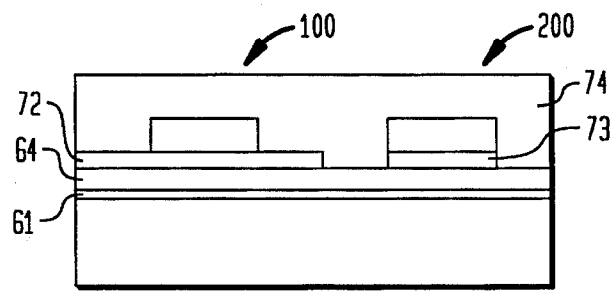
Figure 10D:
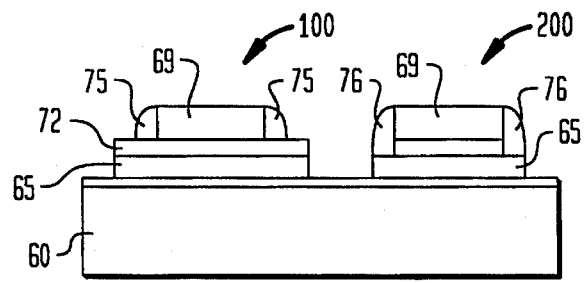
Figure 10E:
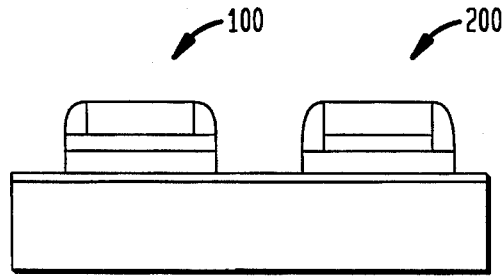

Referring to FIG. 10(c), the photo-resist 71 is removed. A third layer of polysilicon 74 is deposited and doped to a doping concentration of approximately $10^{21}/cm^3$. Next, a blanket etch process is performed. During this process the third layer of polysilicon is etched so as to form polysilicon or polysilicide spacers 75 for the "off" cell 100 and polysilicon or polysilicide spacers 76 for the "on" cell 200, as shown in FIG. 10(d). The "off" cell spacers 75 are in contact with the control gate 69 and the insulating layer 61, whereas the "on" cell spacers 76 are in contact with the both the control gate 69 and the floating gate 65. The next steps are to etch the nitride and the polysilicon layers, as shown in FIG. 10(e). The device is completed by conventional back-end processes, such as metallization and passivation.

Finally, the above-described embodiments of the invention are intended to be illustrative only. Numerous alternative embodiments may be devised by those skilled in the art without departing from the spirit and scope of the following claims.

I claim:

1. A read only memory cell programmed to be in an "off" state, comprising:

a gate oxide grown on a substrate of a first dopant type, a floating gate disposed on said gate oxide, an insulating layer extending over an entire length of said floating gate, a control gate having two sides and extending over a portion of said insulating layer, leaving first and second portions of said insulating layer exposed on each side, and first and second spacers disposed on each side of said control gate and over said first and second exposed portions of said insulating layer, wherein said first and second spacers are configured to not contact said floating gate, so that said first and second spacers do not short said control gate to said floating gate to result in an "off" state memory cell.

2. The cell of claim 1, wherein said insulting layer is nitride.

3. The cell of claim 1, wherein said first dopant type is P-type.

4. An array of memory cells, comprising:

a substrate of a first dopant type, a plurality of parallel buried bit lines of a second dopant type formed in said substrate, a plurality of floating gates disposed between said parallel buried bit lines, a plurality of polysilicon wordlines formed over said floating gates and orthogonal to said buried bit lines, an insulating layer separating said floating gates from said polysilicon wordlines, control gates formed over said insulting layer, and conductive spacers between said polysilicon wordlines, wherein said spacers contact said insulating layer and said polysilicon wordline and said spacers are configured to not contact said floating gates, so that said spacers do not short said control gates for cells selected to be programmed "off", and said conductive spacers are configured to contact said floating gates, said polysilicon wordlines, and said insulating layer, so that said spacers are configured to short said control gates to said floating gates for cells selected to be programmed "on".

5. The array of claim 4, wherein said first dopant type is P-type and said second dopant type is $N^+$-type.

6. The array of claim 4, wherein said insulating layer is nitride.

7. The array of claim 4, wherein said spacers are made of one of polysilicon and polysilicide.

8. A ROM cell, comprising:

a substrate including first and second bit lines spaced apart by a channel, a floating gate formed over said channel, a control gate formed over said floating gate, said floating gate and said control gate being connected by a conducting path formed by conductive spacers, said spacers configured to short said control gate to said floating gate if said cell is programmed to be on, and said floating gate and said control gate being insulated from one another by spacers, said spacers configured not to contact said floating gate so that said spacers do not short said control gate to said floating gate if said cell is programmed to be off.

9. A ROM array, comprising:

a plurality of cells formed in a substrate, each of said cells including first and second bit lines separated by a channel, a floating gate formed over said channel, and a control gate formed over said floating gate, wherein for a first plurality of said cells said floating gate and said control gate are electrically connected by conductive spacers located on sides of said control gate, the spacers configured to short said control gate to said floating gate and for a second plurality of said cells said floating gate and said control gate are electrically insulated by spacers located on the sides of said control gate and configured not to contact said floating gate so that said spacers do not short said control gate to said floating gate.

10. The read only memory cell of claim 1, wherein said first and second spacers are conductive.

11. The read only memory cell of claim 1, wherein said first and second spacers are polysilicon.

12. The array of memory cell of claim 4, wherein said bit lines do not contact said floating gate.

* * * * *